(12) United States Patent
Xu et al.

(10) Patent No.: US 11,133,796 B2
(45) Date of Patent: Sep. 28, 2021

(54) DYNAMIC IGBT GATE DRIVE TO REDUCE SWITCHING LOSS

(71) Applicant: Ford Global Technologies, LLC, Dearborn, MI (US)

(72) Inventors: Zhuxian Xu, Novi, MI (US); Chingchi Chen, Ann Arbor, MI (US); Ke Zou, Canton, MI (US); Xi Lu, Northville, MI (US); Michael W. Degner, Novi, MI (US); Jun Kikuchi, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1337 days.

(21) Appl. No.: 15/067,878

(22) Filed: Mar. 11, 2016

(65) Prior Publication Data

US 2017/0264284 A1    Sep. 14, 2017

(51) Int. Cl.
| | | |
|---|---|---|
| *H02P 1/00* | (2006.01) | |
| *H03K 17/16* | (2006.01) | |
| *H02M 1/08* | (2006.01) | |
| *B60L 50/51* | (2019.01) | |
| *H02M 1/088* | (2006.01) | |
| *H03K 17/567* | (2006.01) | |
| *H02M 7/5387* | (2007.01) | |
| *H02M 1/15* | (2006.01) | |
| *H02M 3/158* | (2006.01) | |
| *H02M 1/00* | (2006.01) | |

(52) U.S. Cl.
CPC ............ *H03K 17/168* (2013.01); *B60L 50/51* (2019.02); *H02M 1/08* (2013.01); *H02M 1/088* (2013.01); *H03K 17/166* (2013.01); *H03K 17/567* (2013.01); *H02M 1/0054* (2021.05); *H02M 1/15* (2013.01); *H02M 3/1588* (2013.01); *H02M 7/5387* (2013.01); *Y02B 70/10* (2013.01)

(58) Field of Classification Search
CPC ................ H03K 17/168; H03K 17/567; B60L 11/1803; H02M 1/088; H02M 2001/0054
USPC ........................................................ 318/139
See application file for complete search history.

(56) References Cited

U.S. PATENT DOCUMENTS

| | | | |
|---|---|---|---|
| 6,208,185 B1 | 3/2001 | John et al. | |
| 6,291,952 B1* | 9/2001 | Roth-Stielow | ............ H02P 3/04 318/366 |
| 7,339,331 B2 | 3/2008 | Vanderzon | |
| 2002/0149331 A1* | 10/2002 | Marcinkiewicz | .... B23K 20/121 318/254.1 |
| 2006/0186933 A1 | 8/2006 | Kimura et al. | |
| 2008/0303560 A1* | 12/2008 | Higashi | .............. H03K 17/0406 327/108 |

(Continued)

FOREIGN PATENT DOCUMENTS

| | | |
|---|---|---|
| CN | 1033253 C | 11/1996 |
| WO | 2014154221 A2 | 10/2014 |

*Primary Examiner* — Eduardo Colon Santana
*Assistant Examiner* — Gabriel Agared
(74) *Attorney, Agent, or Firm* — David B. Kelley; Brooks Kushman P.C.

(57) ABSTRACT

A vehicle includes an electric machine, an IGBT, and a gate driver. The IGBT has a gate, an emitter, and a collector and is configured to flow an electric charge through a phase of the electric machine. The gate driver is configured to flow current onto the gate at a first level, and in response to a time integral of a voltage across the phase exceeding a predetermined level, transition from the first level to a second level less than the first level.

18 Claims, 5 Drawing Sheets

(56) References Cited

U.S. PATENT DOCUMENTS

| | | | |
|---|---|---|---|
| 2013/0082741 A1* | 4/2013 | Domes | H03K 17/18 |
| | | | 327/79 |
| 2013/0229209 A1* | 9/2013 | Miyauchi | H03K 17/56 |
| | | | 327/109 |
| 2013/0285712 A1 | 10/2013 | Kanschat et al. | |
| 2014/0368240 A1 | 12/2014 | Shelton et al. | |
| 2014/0375362 A1 | 12/2014 | Lobsiger et al. | |
| 2015/0162905 A1* | 6/2015 | Wagoner | H03K 17/0412 |
| | | | 327/432 |
| 2016/0142048 A1* | 5/2016 | Zoels | H02M 1/08 |
| | | | 327/109 |

* cited by examiner

DYNAMIC IGBT GATE DRIVE TO REDUCE SWITCHING LOSS

TECHNICAL FIELD

This application is generally related to control of a gate current to an IGBT in a hybrid-electric powertrain in which the gate current has at least two constant current levels.

BACKGROUND

Electrified vehicles including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range. The terminal voltage of a typical traction battery is over 100 Volts DC, and the traction battery is alternatively referred to as a high-voltage battery. However, improved performance of electric machines may be achieved by operating in a different voltage range, typically at higher voltages than the traction battery.

Many electrified vehicles include a DC-DC converter also referred to as a variable voltage converter (VVC) to convert the voltage of the traction battery to an operational voltage level of the electric machine. The electric machine that may include a traction motor may require a high voltage and high current. Due to the voltage, current and switching requirements, an Insulated Gate Bipolar junction Transistor (IGBT) is typically used to generate the signals in the power inverter and the VVC.

SUMMARY

A vehicle includes an electric machine, an IGBT, and a gate driver. The IGBT has a gate, an emitter, and a collector and is configured to flow an electric charge through a phase of the electric machine. The gate driver is configured to flow current onto the gate at a first level, and in response to a time integral of a voltage across the phase exceeding a predetermined level, transition from the first level to a second level less than the first level.

A method of controlling an IGBT of a vehicle powertrain includes flowing a current at a first level onto a gate of an IGBT, and in response to a time integral of a voltage across the IGBT exceeding a predetermined threshold, transitioning the current from the first level to a second level less than the first level.

A vehicle powertrain includes an IGBT and a gate driver. The IGBT has a gate, an emitter and a collector. The gate driver is configured to flow current onto the gate at a first level, and in response to a time integral of resulting collector to emitter voltage exceeding a predetermined level, transition from the first level to a second level less than the first level.

DETAILED DESCRIPTION

Figure 1:
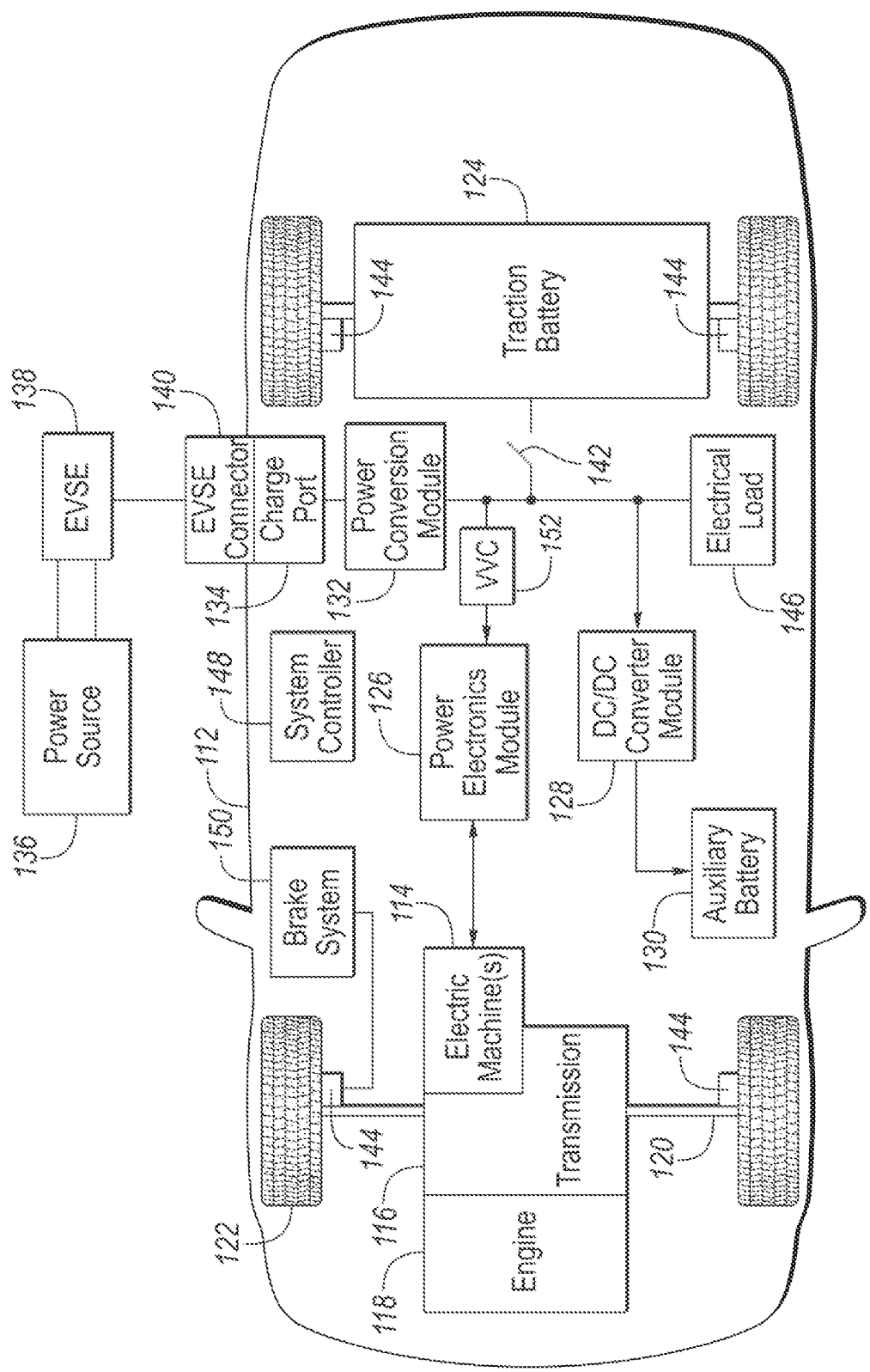
FIG. 1 is a diagram of a hybrid vehicle illustrating typical drivetrain and energy storage components with a power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Semiconductor devices such as metal-oxide-semiconductor field-effect transistor (MOSFET) or Insulated Gate Bipolar junction Transistors (IGBTs) and flyback or freewheeling diodes are widely used in a variety of power systems including but not limited to consumer, medical, and industrial applications, such as electric motor drives and power inverters. Here, gate control of an IGBT is illustrated; however, the concepts and structures are also applicable to MOSFETs Operation of an IGBT is controlled by a gate voltage supplied by a gate driver. Conventional gate drivers are typically based on a voltage, greater than a threshold voltage, applied to an IGBT gate with a current limiting resistor, which consists of a switchable voltage source and gate resistor. A low gate resistance would lead to a fast switching speed and low switching loss, but also cause higher stresses on the semiconductor devices, e.g. overvoltage stress. Therefore, the gate resistance is selected to seek a compromise between switching loss, switching delay, and stresses.

Some disadvantages associated with conventional gate drivers for IGBT turn-on include limited control of switching delay time, current slope and voltage slope such that optimization switching losses is limited. Another disadvantage is that a gate resistance is typically selected based on worst case operating condition thus introducing excessive switching losses under normal operating conditions. For example, at a high dc bus voltage, a gate resistance is selected based on a change in current with respect to time (di/dt) in order to avoid excessive diode voltage overshoot during diode fly-back of the load. However, at low dc bus voltage the use of the gate resistance selected to protect for high bus voltages introduces excessive switching losses as a switching speed is then reduced by the gate resistance even though diode over-voltage is below a threshold.

A smart gate driving strategy is critical to achieve optimal switching performance for the whole switching trajectory and over all the operating ranges. Here, a proposed stepwise current source gate driving strategy with feedback of operating conditions (e.g., voltage, load current, temperature, etc.) for IGBT turn-on is presented. In one embodiment, a two-step gate driving profile is composed of a high current pulse (Ig1) driven for a first predetermined time followed by a low current pulse (Ig2) driven for a second predetermined time. The high current pulse is selected to reduce the turn-on delay time, as well as increase switching speed and reduce switching loss. The low current pulse slows down the switching speed to avoid the excessive voltage overshoot across the associated freewheeling diode. The timing for each pulse stage is adaptive to IGBT operating conditions, e.g., switched voltage (Vce), to realize the optimal switching performance over the whole operating ranges. The gate driver produces the longest Ig1 possible based on the operating conditions, in order to achieve a minimum switching loss while keeping the diode voltage overshoot within a safety limit. At low voltage cases, Ig1 could go all the way through the turn on transient, allowing a fast completion of switching transient to avoid excessive turn-on loss.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
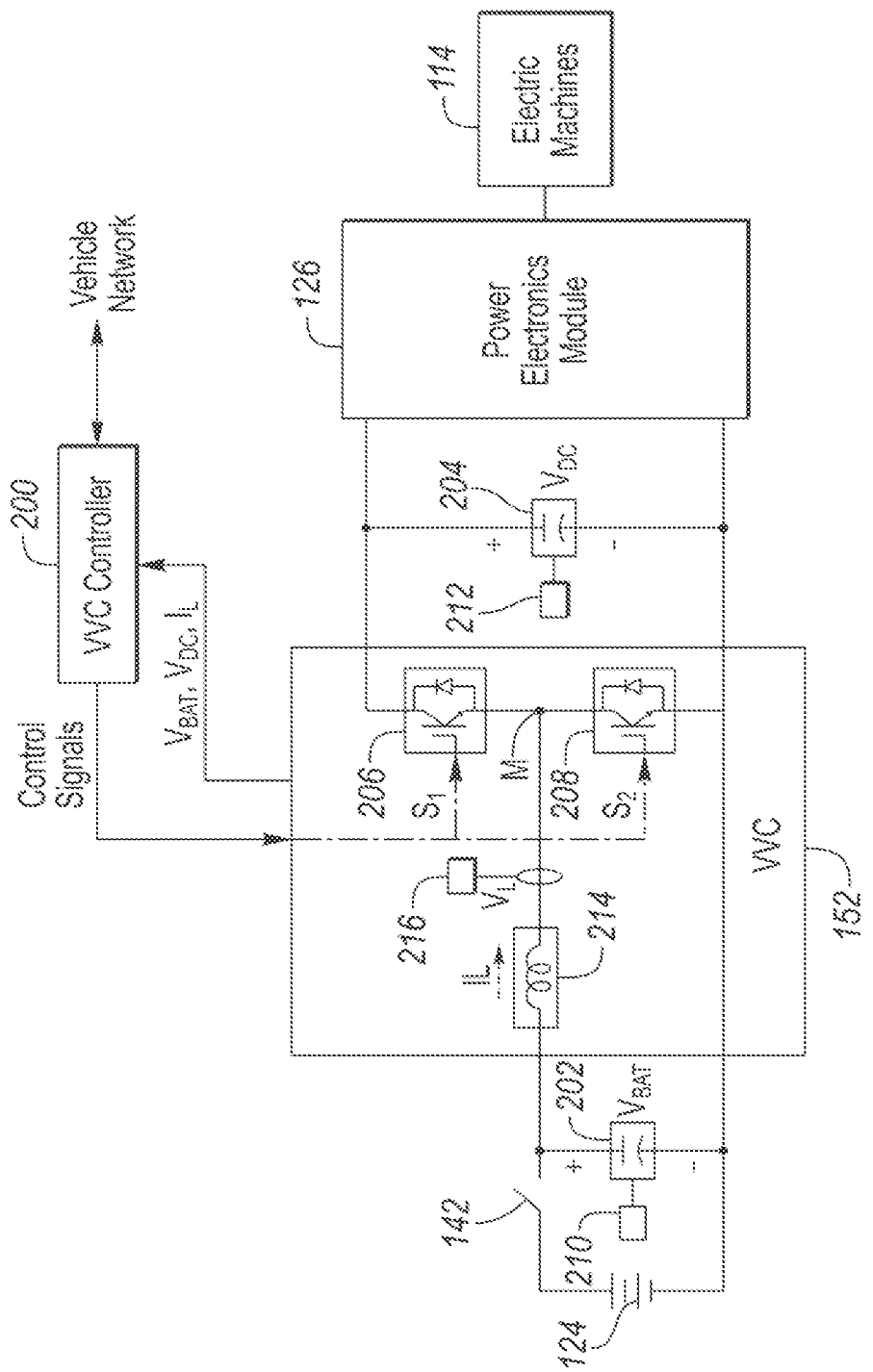
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V_{dc}^*$. The VVC controller 200 may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \quad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214 may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V_{dc}^*$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208).

Figure 4:
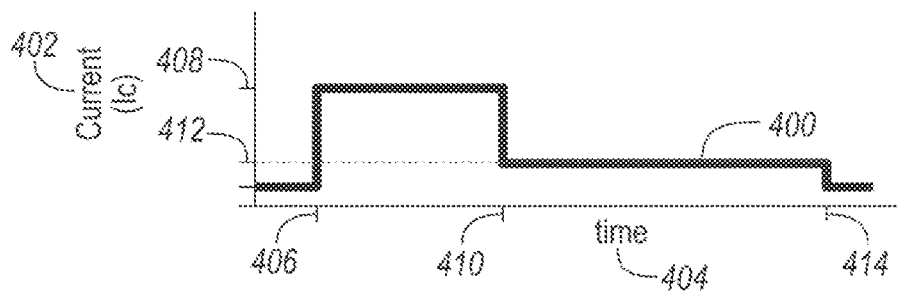
FIG. 4 is a graphical representation of a gate current with respect to time.
Figure 5:
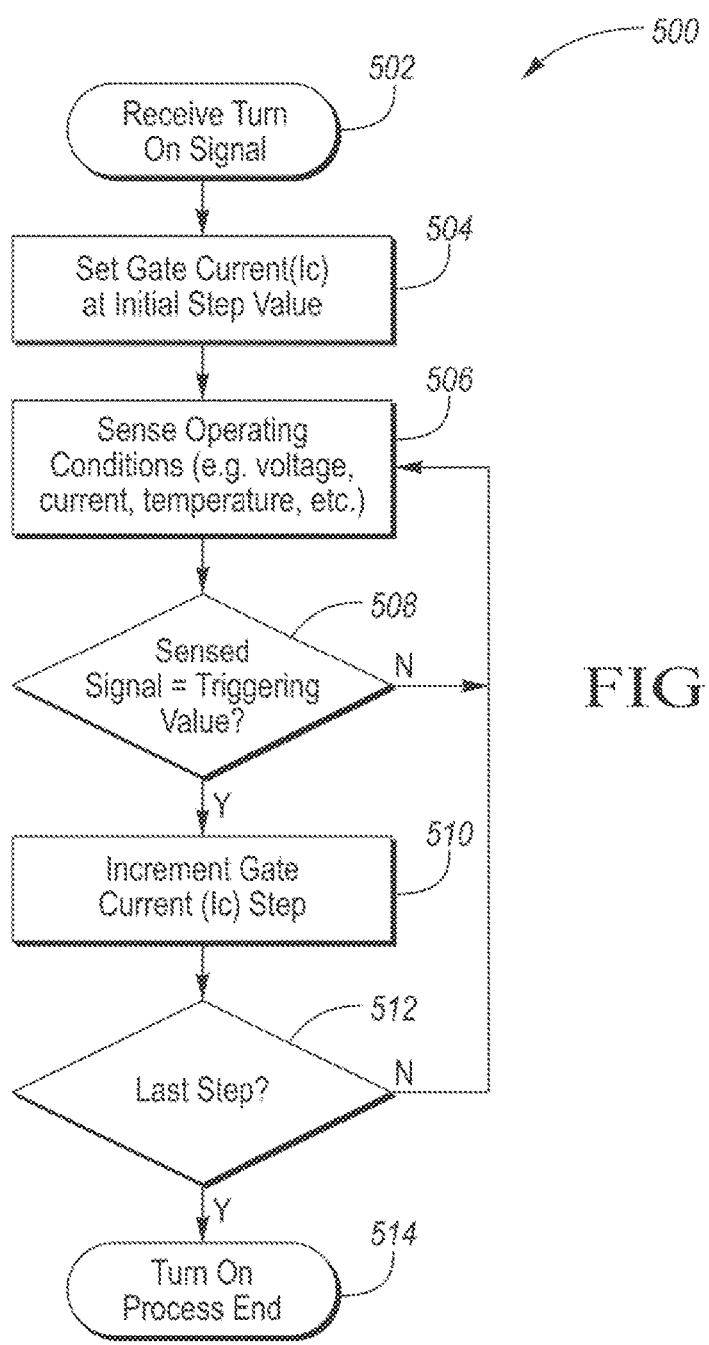
FIG. 5 is a flow diagram of a method to drive a gate of an IGBT.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current as illustrated in FIG. 4. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
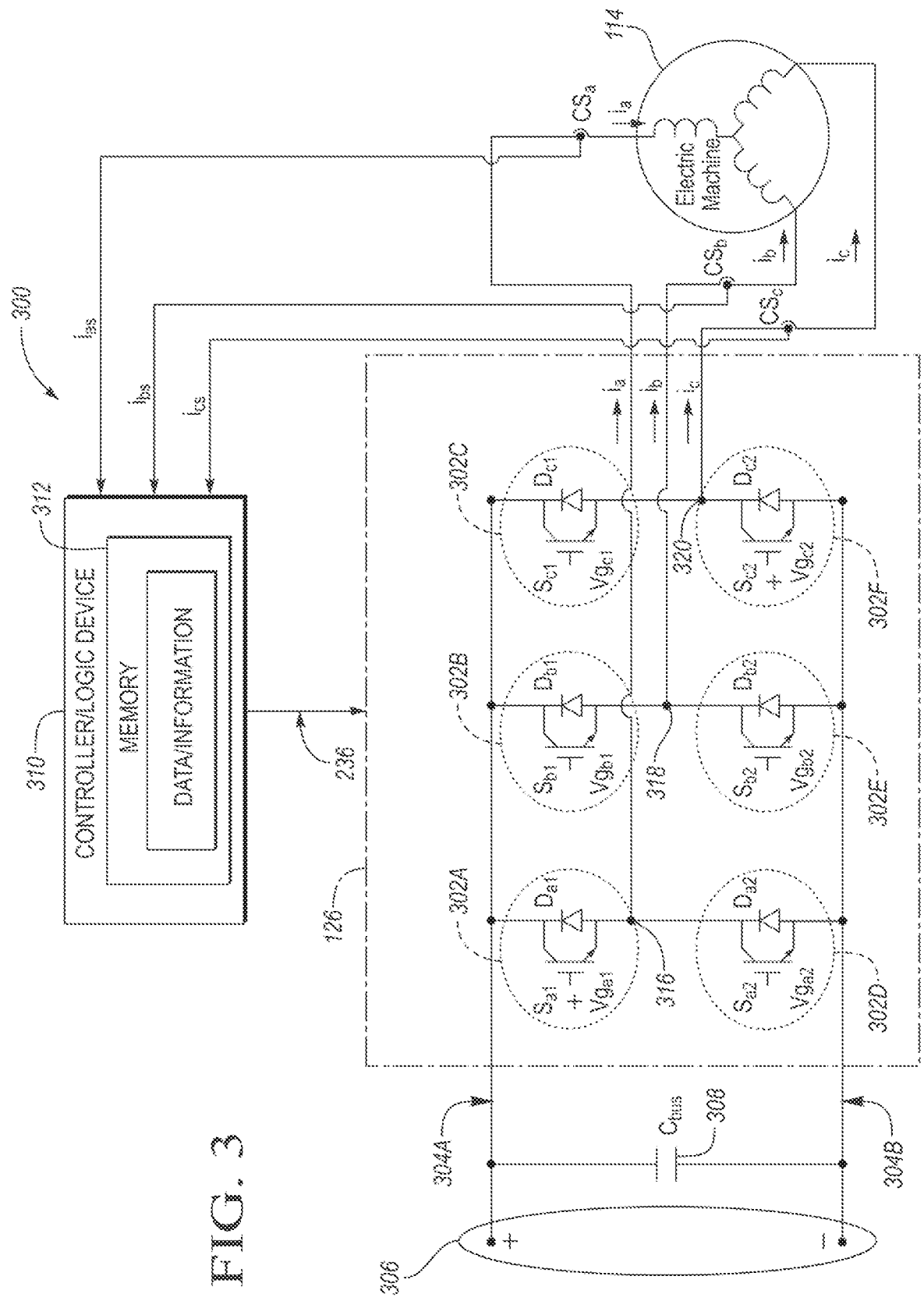
FIG. 3 is a schematic diagram of a vehicular electric motor inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 2: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

FIG. 4 is an example graphical representation of a profile 400 of a gate current 402 with respect to time 404. Here, the profile 400 includes an increase of the gate current 402 at time 406 to a first gate current level 408 ($I_{g1}$). The gate current 402 is substantially maintained until a transition time 410 at which the first gate current level 408 is reduced to a second gate current level 412 ($I_{g2}$). The time the gate current is maintained at the first gate current level 408 ($I_{g1}$) is referred to as a high time or initial gate current drive time (t1). The first gate current level 408 may be based on many factors including device characteristics, operating conditions, and load characteristics. The first gate current level 408 may be explained by the trade-off between performance and cost. Generally, the higher the first gate current level 408 is, the lower the loss is. However, the gate current is limited by gate driver capabilities, as the cost associated with the gate driver is typically directly proportional with the gate driver capabilities. The device characteristics include a gate resistance, a gate capacitance, a threshold voltage, a max collector current, a diode forward current, and other IGBT characteristics. The operating conditions include a temperature, a switching speed, a PWM duty cycle, a supply voltage, and a vehicle speed. The load characteristics include an inductance, a resistance, a max current, rotational speed, potential energy, kinetic energy, and other electrical or electro-mechanical characteristics. The second gate current level 412 may be based on many factors including the factors used for the first gate current level 408. The second gate current level 412 is determined by diode voltage spike in the worst operating case (i.e., maximum dc bus voltage and maximum load current). The second gate current level 412 ($I_{g2}$) is maintained from time 410 until time 414. The time the gate current is maintained at the second gate current level 412 ($I_{g2}$) is referred to as a low time or second gate current drive time (t2).

The transition time 410 may be implemented by a variety of methods including a pre-set driving profile, an open-loop control system, a closed-loop control system, an analog control system, a digital control system, an adaptive control system, a fuzzy logic control system, and a neural network system. In a first embodiment, the transition time may be in response to an integral over a time period, also referred to as a time integral, of a load driven by the IGBT exceeding a reference threshold. The device characteristics may include a gate resistance, or a gate capacitance. The operating conditions may include a switching speed or an IGBT temperature. The load characteristics may include a load inductance, a load capacitance, or a load resistance. In yet another embodiment, the transition time may be in response to a time integral of a voltage measured from the emitter to the collector of the IGBT exceeding a reference threshold.

FIG. 5 is an example flow diagram 500 of a method to drive a gate of an IGBT. In operation 502, a controller receives signal to turn on an IGBT device after the controller proceeds to operation 504. In operation 504, the controller determines an initial gate current level. Generally, a turn-on switching loss is inversely proportional to the gate current level. However, the initial gate current may also be limited by gate driver capabilities, as the cost associated with the gate driver is typically directly proportional with the gate driver capabilities. For example, a gate driver with higher driving capabilities is typically more expensive than a gate driver with lower driving capabilities.

In operation 504, the controller selects the initial gate current based on multiple factors including a switching loss of the IGBT device, a gate driver loss, and a capability of a gate driving circuit. Once the initial gate current is selected, the controller proceeds to operation 506. For example, the initial gate current level may be $I_{g1}$ from FIG. 4.

In operation 506, the controller monitors operating conditions of the IGBT device. The operating conditions monitored include a voltage across the collector and emitter of the IGBT device, a current flowing into a collector of the IGBT device, a voltage across a load coupled with either a collector or an emitter of the IGBT, a current flowing to the load coupled with either the collector or the emitter of the IGBT or a temperature of the IGBT device. The monitoring may include measuring a characteristic and calculating a time integral of a component. For example, an inverter to drive an electric machine may have an IGBT device coupled with each phase of the electric machine. The controller of the IGBT device may calculate or receive as an input the time integral of a voltage across a phase of the electric machine coupled with the IGBT. Typically, the voltage across IGBT is directly measured. The different between the voltage across IGBT and the voltage across the phase of the electric machine equals the dc bus voltage, along with some voltage drop on the parasitic inductances.

In operation 508, the controller compares the sensed signal from operation 506 with a trigger value. For example, the controller may compare the time integral of the voltage across the phase of the electric machine coupled with the IGBT with a predetermined value. The length of the initial gate current is important as a longer initial gate current drive time leads to a higher IGBT di/dt and a higher voltage spike across the freewheeling diode. Here, initial gate current drive time is gradually increased until the time integral of the voltage of the load (such as a phase of the electric machine for an inverter or an inductor load for a DC-DC converter) exceeds a predetermined threshold. The predetermined threshold is a point in which a voltage across the freewheeling diode spikes to a limit less than a breakdown voltage of the IGBT. This voltage is dependent upon many conditions such as a supply voltage for the electric machine or a supply voltage for the DC-DC converter. Upon reaching or exceeding the predetermined threshold, the controller will proceed to operation 510. While the time integral is less than the predetermined threshold, the controller will branch back to operation 506.

In operation 510, the controller decrements the gate current to a lower gate current level and monitors the IGBT operation. For example, in FIG. 4, the gate current is reduced from $I_{g1}$ to $I_{g2}$, operation 510 may include the transition from $I_{g1}$ to $I_{g2}$, followed by monitoring the IGBT operation until time 414. In practice, the initial gate current level is usually larger than the lower gate current level. The lower gate current level is selected to avoid the excessive voltage overshoot across the freewheeling diode during multiple operating ranges. Typically a worst case operating condition (e.g., maximum dc bus voltage) is selected to determine the lower gate current level. Once a baseline is determined, the lower gate current level may be increased gradually until a voltage spike across the freewheeling diode exceeds a limit. Therefore, the lower gate current level may be determined based on a DC bus voltage, or a battery voltage.

In operation 512, the controller compares an amount of charge applied to the gate of the IGBT, and if the charge applied to the gate equals a fully enhanced charge level, the controller may reduce the gate current to a leakage gate current level and proceed to operation 514. In operation 514, the controller stops driving a gate current to the IGBT device.

Figure 6:
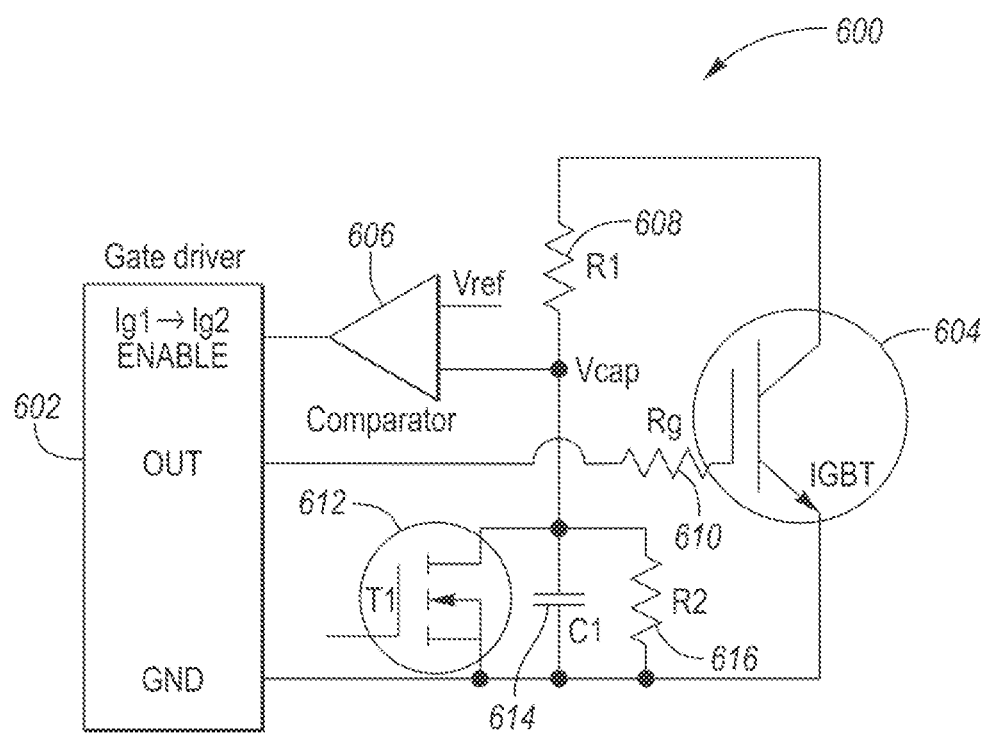
FIG. 6 is a schematic diagram of an IGBT gate drive circuit.

FIG. 6 is an example schematic of a IGBT gate drive circuit 600. Here, a gate driver 602 is configured to drive a gate of an IGBT 604. The circuit 600 includes a comparator 606 to switch states in response to an input exceeding a threshold. The input to the comparator may be coupled with a collector of the IGBT 604 by a resistor 608. In response to a voltage greater than a threshold voltage applied to a gate of the IGBT 604, the IGBT 604 begins conducting a current between the emitter and collector of the IGBT 604. One circuit to measure a time integral of the voltage between the emitter and collector of the IGBT 604 is to enable the MOSFET 612 thus allow a current to flow through the resistor 608 to the capacitor 614 and the resistor 616. When the time integral exceeds the threshold indicated by Vref, the comparator 606 will output a signal to the gate driver controller 602 to enable the transition from Ig1 to Ig2. Based on the desired operation, a gate resistor 610 may be included to soften the turn on and transition. This exemplary circuit is configured to determine the time integral for Vce, however, a similar circuit may be used to determine the time integral for other components such as the load. An advantage of operating based on the time integral of the load includes adaptation of current operating conditions such as rotational speed, kinetic energy of the electric machine, potential energy of the electric machine. Likewise, a similar circuit may be used in a VVC to determine a time integral for a power inductor (e.g. input inductor 214). This adaptive system will adjust the point of the transition time 410, for example, the Ig1 pulse length will increase as the dc bus voltage decreases and may decrease as the dc bus voltage increases.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
an electric machine;
an IGBT having a gate, an emitter, and a collector, configured to flow an electric charge through a phase of the electric machine; and
a gate driver configured to flow current onto the gate at a first level, and in response to a time integral of a voltage across the phase exceeding a predetermined level, transition from the first level to a second level less than the first level.

2. The vehicle of claim 1, wherein the predetermined level is based on an electric potential of the electric charge.

3. The vehicle of claim 1, wherein the first level is based on a gate capacitance of the IGBT, and an electric potential of the electric charge.

4. The vehicle of claim 1 further comprising a freewheeling diode coupled anti-parallel with the IGBT, wherein the predetermined level is derived from an electric potential of the electric charge such that an overshoot voltage across the freewheeling diode does not exceed a diode limit.

5. The vehicle of claim 4, wherein the second level is based on a rate of change of collector current of the IGBT such that a maximum diode voltage does not exceed a breakdown threshold.

6. The vehicle of claim 1, wherein the time integral is for a period beginning when the gate driver receives an IGBT turn-on signal and ending when the gate driver turns off the IGBT.

7. The vehicle of claim 1, wherein the first level is based on a parasitic inductance associated with the gate of the IGBT, and a temperature of the IGBT.

8. A method of controlling an IGBT of a power system comprising:
by a gate driver, flowing a current at a first level onto a gate of an IGBT; and
in response to a time integral of a voltage across the IGBT exceeding a predetermined threshold, transitioning the current from the first level to a second level less than the first level.

9. The method of claim 8, wherein the first level is based on a gate capacitance of the IGBT.

10. The method of claim 8, wherein the second level is based on a rate of change of collector current of the IGBT such that a reverse bias diode voltage across a freewheeling diode, coupled anti-parallel with the IGBT, does not exceed a breakdown threshold.

11. The method of claim 8, wherein the time integral is for a period beginning when the gate driver receives an IGBT turn-on signal and ending when the gate driver turns off the IGBT.

12. The method of claim 8, wherein the predetermined threshold is derived from an electric potential associated with the current such that an overshoot voltage across a freewheeling diode coupled anti-parallel with the IGBT does not exceed a diode limit.

13. A vehicle powertrain comprising:
an IGBT having a gate, an emitter and a collector; and
a gate driver configured to flow current onto the gate at a first level, and in response to a time integral of resulting collector to emitter voltage exceeding a predetermined level, transition from the first level to a second level less than the first level.

14. The vehicle powertrain of claim 13, wherein the first level is based on a gate capacitance of the IGBT and a parasitic inductance of the IGBT.

15. The vehicle powertrain of claim 13 further comprising a freewheeling diode coupled anti-parallel with the IGBT, wherein the predetermined level is derived from a voltage associated with the current such that an overshoot voltage across the freewheeling diode does not exceed a diode limit.

16. The vehicle powertrain of claim 15, wherein the second level is based on a rate of change of collector current of the IGBT such that a maximum diode voltage does not exceed a breakdown threshold.

17. The vehicle powertrain of claim 13, wherein the time integral is for a period beginning when the gate driver receives an IGBT turn-on signal and ending when the gate driver turns off the IGBT.

18. The vehicle powertrain of claim 13, wherein the first level is based on a parasitic inductance associated with the gate of the IGBT, and a temperature of the IGBT.

* * * * *